United States Patent [19]

Brancaleone

[11] 4,326,765

[45] Apr. 27, 1982

[54] ELECTRONIC DEVICE CARRIER

[75] Inventor: Salvatore T. Brancaleone, Tempe, Ariz.

[73] Assignee: International Telephone and Telegraph Corporation, New York, N.Y.

[21] Appl. No.: 140,582

[22] Filed: Apr. 15, 1980

[51] Int. Cl.³ .................. H01R 13/66; H01R 23/68
[52] U.S. Cl. .................. 339/17 CF; 339/18 P; 339/147 R
[58] Field of Search .......... 339/17 CF, 17 LM, 17 M, 339/17 C, 17 N, 18 R, 18 B, 18 C, 18 P, 19, 147 R, 147 P, 154-156, 176 M, 176 MP, 174

[56] References Cited

U.S. PATENT DOCUMENTS

| 3,173,732 | 3/1965 | James | 339/17 LM |
| 3,364,458 | 1/1968 | Black, Jr. et al. | 339/154 A |
| 3,544,950 | 12/1970 | Lopez et al. | 339/17 D |
| 3,858,961 | 1/1975 | Goodman et al. | 339/176 MP |
| 3,955,867 | 5/1976 | Braun et al. | 339/17 CF |
| 4,018,495 | 4/1977 | Freitag | 339/75 MP |
| 4,029,374 | 6/1977 | Nestor et al. | 339/17 LM |

FOREIGN PATENT DOCUMENTS 1437998 6/1976 United Kingdom ........ 339/176 MP

*Primary Examiner*—Neil Abrams
*Attorney, Agent, or Firm*—Thomas L. Peterson

[57] ABSTRACT

A carrier for an electronic package assembly is disclosed in which the carrier contains an electronic chip having conductors which are engaged by contacts mounted in selected contact cavities in the carrier. The carrier may be sandwiched between a dual-in-line plug (DIP) and a DIP adapter. The leads of the DIP extend through the contact cavities in the carrier, engaging the contacts therein, and donwardly into the contact cavities of the DIP adapter engaging contacts therein having posts mounted in holes in a printed circuit board below the adapter.

11 Claims, 17 Drawing Figures

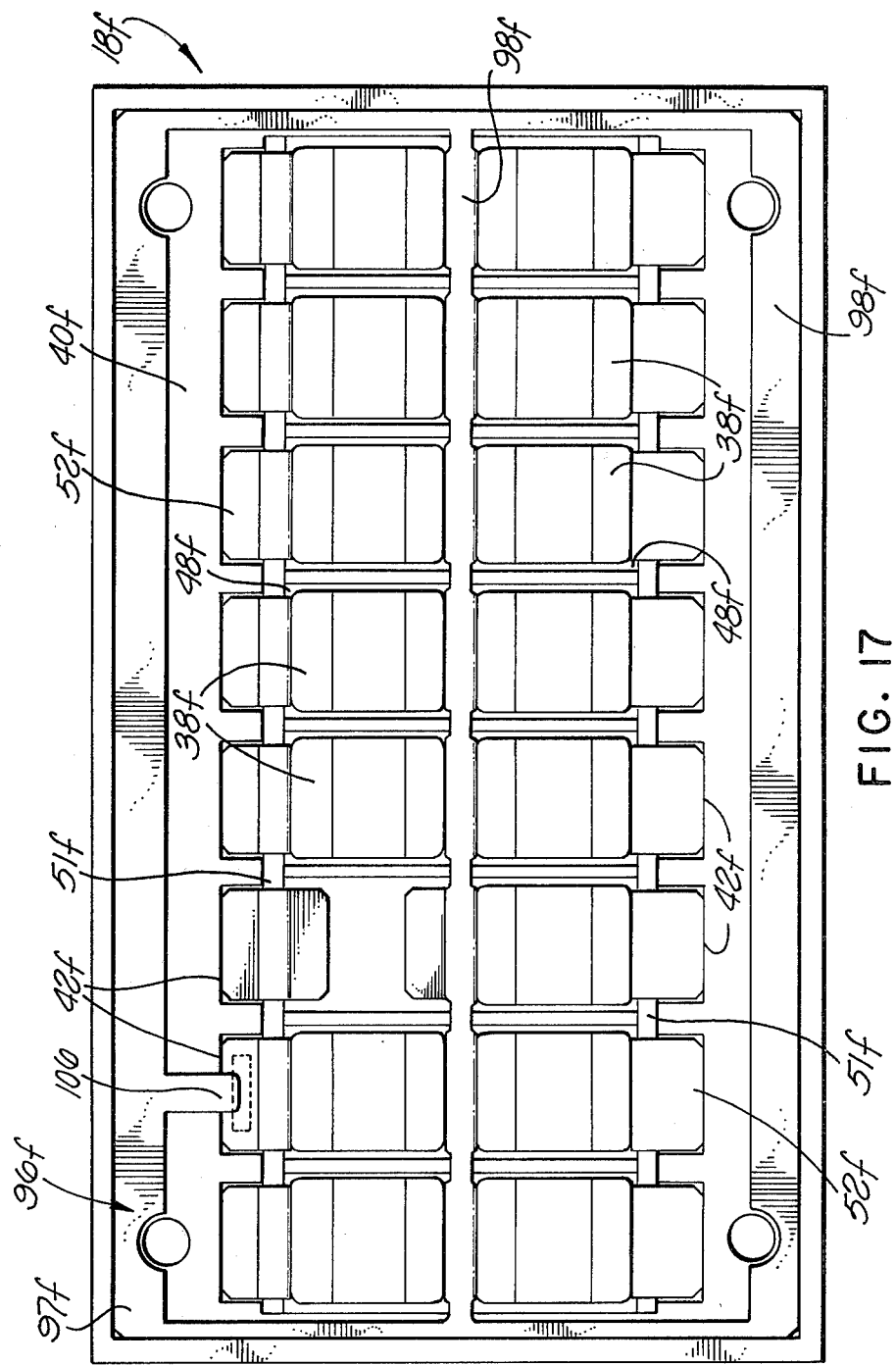

ELECTRONIC DEVICE CARRIER

BACKGROUND OF THE INVENTION

The present invention relates generally to a carrier for microelectronic devices and, more particularly, to an electronic package assembly in which the carrier provides electrical connection between a microcircuit chip mounted in the carrier and the leads of a DIP and the contacts of a DIP adapter.

DIP packages comprise a fairly standardized means of packaging circuit elements which consist of anything from a plurality of discrete circuit components to a large scale integrated circuit chip. The DIP may consist of a main body having two rows of pins or leads extending from the sides thereof and bent downwardly. In some applications, the DIP is mounted directly upon a printed circuit board with its leads extending through plated-through holes in the board. In other applications, the leads of the DIP extend into socket contacts in a DIP adapter or socket. The contacts of the adapter embody tails or posts which are mounted in the holes in the printed circuit board. There is a need for attaching additional electronic components to DIP circuits and printed circuit board conductors. This normally requires that the boards be made larger and more complex. Furthermore, it is difficult, if not impractical, to change the circuits between the DIPs and the board.

The following is a list of U.S. Pat. Nos. which disclose a variety of DIP adapters: 3,846,734; 3,854,788; 3,880,493; 3,989,331 and 4,060,296.

It is the object of the present invention to overcome the aforementioned limitations of electronic packaging arrangements by providing means for easily adding or removing microelectronic devices to the DIP-printed circuit board couple.

SUMMARY OF THE INVENTION

According to a principal aspect of the present invention, there is provided a carrier adapted to receive a row of conductive pins mounted on an electrical component, such as a DIP. The carrier comprises an insulator having a plurality of contact cavities therein extending from the top surface to the bottom surface of the insulator. The cavities are arranged in a row corresponding to the row of pins on the electrical component. A recess is formed in the insulator spaced from the row of cavities defining therebetween an insulation barrier. The recess is adapted to receive one or more microelectronic devices having conductors on their sides. Contacts are mounted in selected ones of the contact cavities. Each contact has a first spring portion which extends into the contact cavity for engaging a pin on the electrical component (DIP) extending into the cavity, and a second spring portion extending into the recess for engaging a conductor on the microelectronic device mounted in the recess. Each contact also includes a bridging portion which extends around the insulation barrier of the insulator.

The aforementioned carrier may be mounted between a DIP and a DIP adapter, with the leads of the DIP extending through the contact cavities in the carrier, engaging the contacts therein, and into the DIP adapter to engage the socket contacts therein, which may have posts mounted in plated-through holes in a printed circuit board. Thus, the electronic package assembly of the present invention provides an electrical interconnection between the leads of a DIP, the conductors of a microelectronic device mounted on the carrier, and the traces on a printed circuit board. Therefore, the DIP-printed circuit board couple may be altered without increasing the size or complexity of the board, and changes in the couple may be readily made by removing the DIP from the carrier, and substituting or adding electronic devices to the carrier.

BRIEF DESCRIPTION OF THE DRAWINGS

FIG. 17 is a top plan view of a further embodiment of the carrier of the present invention having a ground bus strip mounted thereon.

DESCRIPTION OF THE PREFERRED EMBODIMENTS

Figure 1:
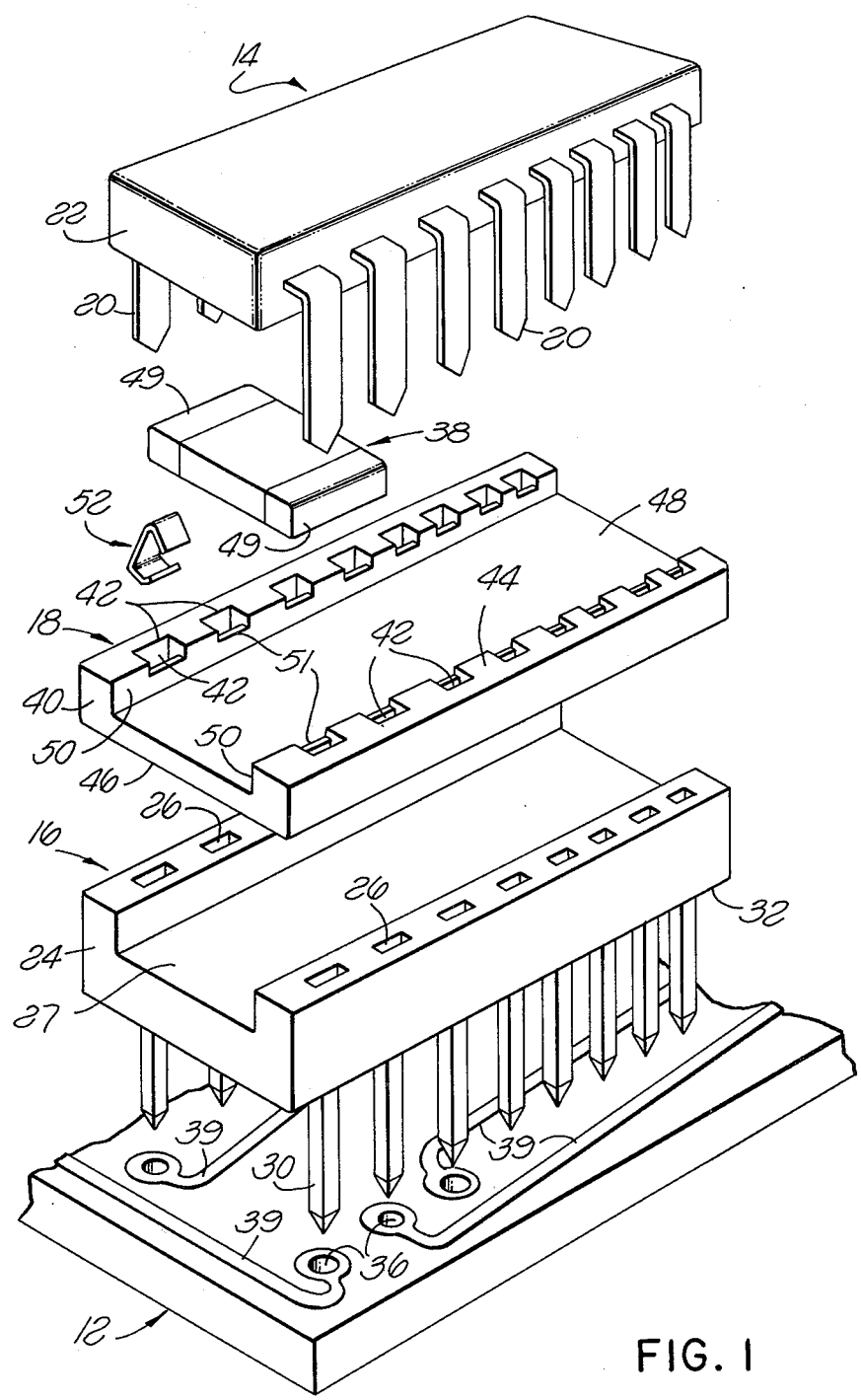
FIG. 1 is an exploded perspective view of the electronic package assembly of the present invention mounted over a printed circuit board, showing a single contact and microelectronic device for the carrier of the assembly.

Reference is now made to FIGS. 1-4 of the drawings in detail, which show one embodiment of the electronic package assembly of the present invention, generally designated 10, mounted on a printed circuit board 12.

The assembly 10 comprises an electrical component 14, such as a DIP, a DIP adapter or socket 16 and the novel carrier 18 of the present invention disposed therebetween. The DIP embodies two rows of pins or leads 20 which extend outwardly from the sides of the body 22 of the DIP and are bent downwardly in the conventional manner. The component 14 could also comprise a printed circuit board connector having two rows of contacts therein with downwardly extending posts or tails on the contacts, or other forms of electrical connectors, as desired.

The DIP adapter 16 is of conventional form, and comprises an insulator 24 containing two rows of contact cavities 26 extending along the opposite sides of a central, longitudinally extending recess 27. Each cavity 26 contains a socket contact 28 having a wire-wrap post or tail 30 extending downwardly from the bottom 32 of the insulator 24. The socket contact embodies a pair of upwardly extending bowed spring beams 34 between which the pins 20 on the DIP 14 extend when the DIP is mounted over the adapter 16. The adapter 16 is mounted on the printed circuit board 12 with the contact tails 30 mounted in plated-through holes 36 on the board which are provided at the ends of a plurality of conductive traces 38 on the board. The tails 30 may be soldered or press-fit into the holes 36.

In accordance with the invention, the carrier 18, which is adapted to contain one or more microelectronic devices 38, is mounted between the DIP 14 and the adapter 16. The device 38 may be a microcircuit chip or the like. The carrier 18 comprises an insulator 40 having two rows of contact cavities 42 extending along the opposite edges of the insulator, and opening at the top surface 44 and bottom surface 46 thereof. A longitudinally extending recess 48 is formed in the insulator 40 between the two rows of contact cavities and opens at the upper surface 44 of the insulator. The width of the recess 48 is dimensioned to receive the device 38 with the conductors or electrodes 49 thereof positioned closely to, but spaced from, the sides 50 of the recess. The sides of the recess 48 are spaced from the two rows of contact cavities 42 providing an insulation barrier 51 therebetween.

Contacts 52 are mounted in selected ones of the contact cavities 42, depending upon the longitudinal position of the device 38, or devices, mounted in the recess 48, and the electrical connection path which is desired between the DIP 14, the device and the conductive traces 38 on the PC board 12.

Each contact has a downwardly and inwardly extending inner spring portion 54 and a downwardly and outwardly extending outer spring portion 56 interconnected by a bridging portion 58. The inner spring portion 54 extends into the recess 48 for engaging a conductor 49 on the device 38. The outer spring portion 56 of the contact extends into the cavity 42, and includes a reversely bent end section 60 terminating in a laterally inwardly extending latching tab 62. Thus, the portions 56 and 60 of the contact provide an arcuate spring contacting area 64 adjacent to the outer side 66 of the contact cavity. The tab 62 of the contact extends into a slot 68 opening to the bottom surface 46 of the insulator and the inner side 70 of the contact cavity for retaining the contact in the cavity.

A slot 71 is formed in the upper portion of the insulation barrier 51 extending between each contact cavity 42 and the recess 48. The bridging portion 58 of each contact extends through the slot 70, resting upon the top 72 of the barrier 51 in that region.

Figure 3:
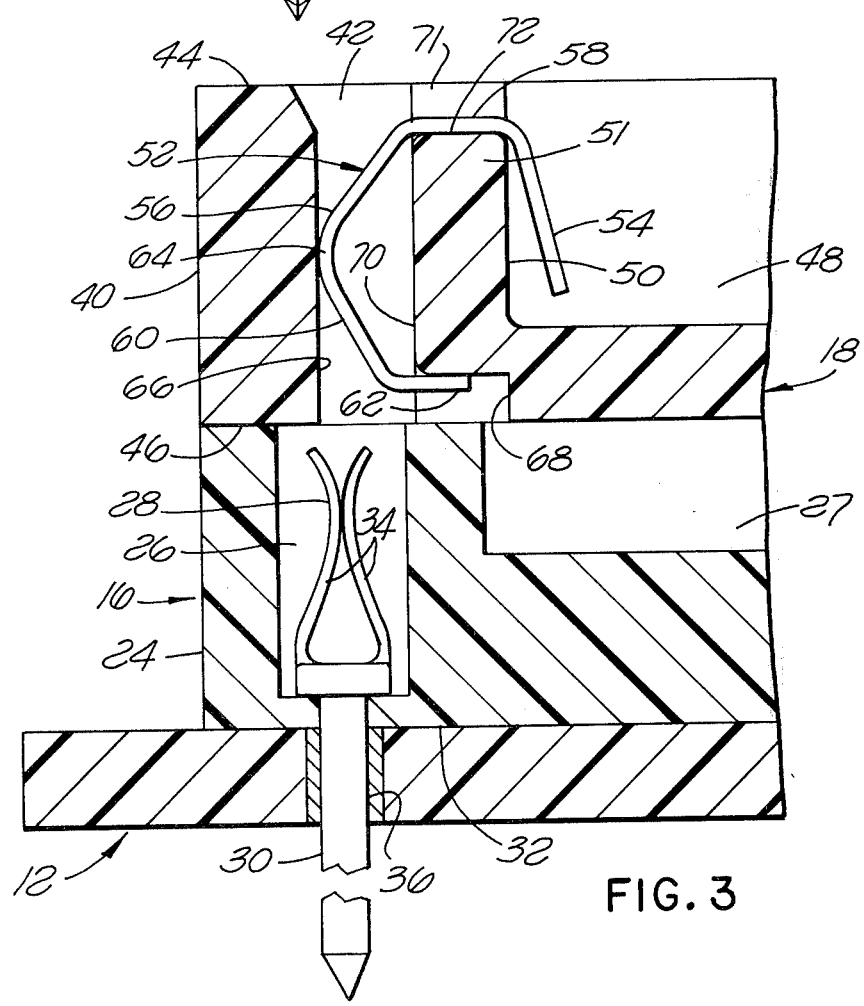
FIG. 3 is a fragmentary, vertical transverse sectional view through the assembly of FIG. 2 without the DIP mounted thereon.
Figure 4:
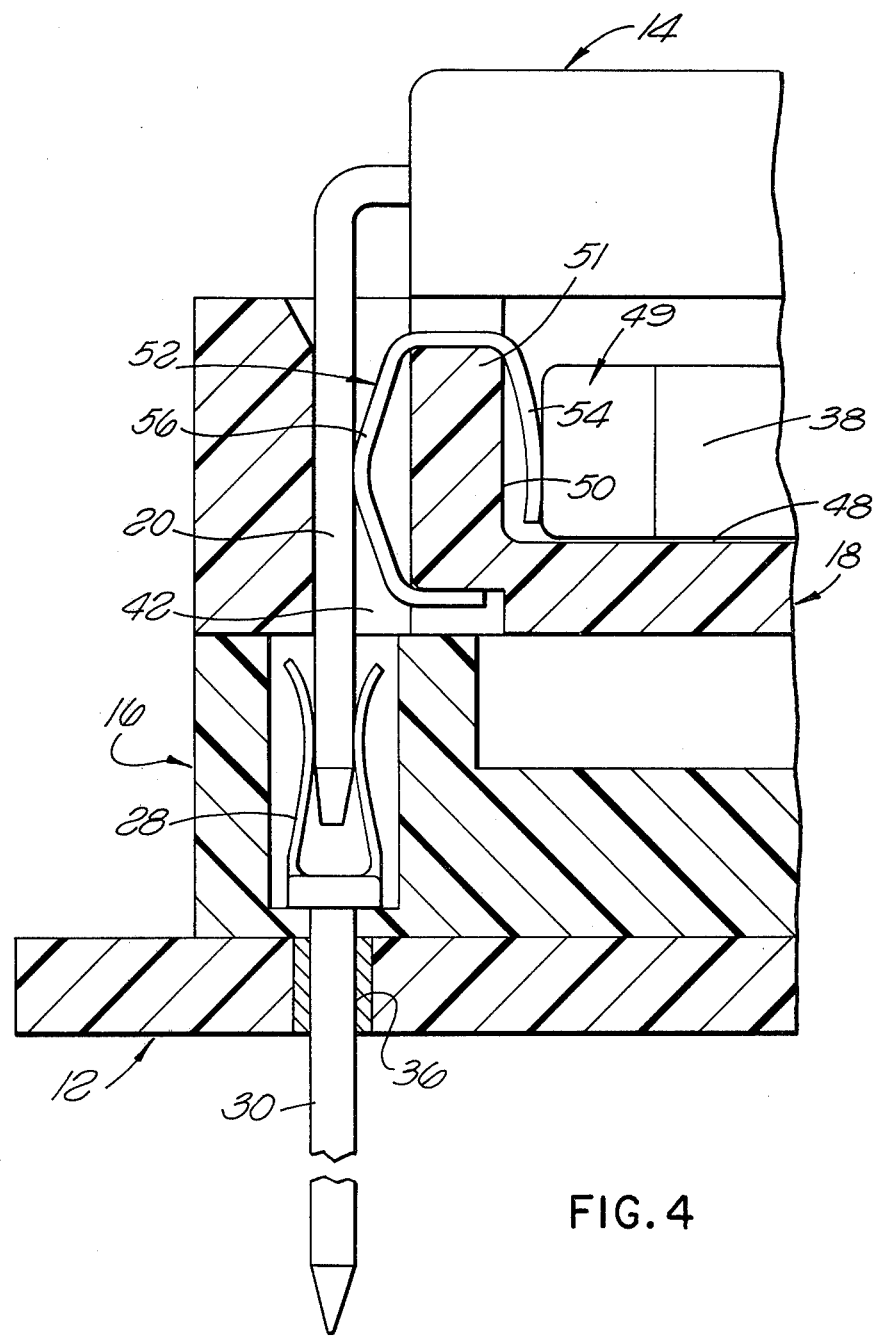
FIG. 4 is a fragmentary, transverse vertical partial sectional view similar to FIG. 3 but showing the DIP mounted on the carrier and DIP adapter of the assembly.

The contact 52 is mounted in the cavity 42 by disposing the contact at a slight angle and pushing the lower end 60 of the contact into the cavity until the latching tab 62 snaps into the slot 68 whereupon the contact assumes the position illustrated in FIGS. 3 and 4. The contact may be moved by pulling upwardly at an angle on the upper portion 56 thereof to release the tab 62 from slot 68. Thus, it will be appreciated that contacts 52 may be selectively mounted in the desired contact cavities in the carrier, and removed therefrom or shifted to other cavities as required by the user.

FIG. 3 illustrates the carrier 18 and DIP adapter 16 mounted on the printed circuit board 12. FIG. 4 shows the DIP 14 mounted on top of the carrier 18, with a lead 20 extending downwardly through the cavity 42 into the socket contact 28 of the adapter. The device 38 is also shown mounted in the recess 48 of the carrier. The inner and outer spring portions 54 and 56 of the contact 52 resiliently engage one conductor 49 of the device and the lead 20 of the DIP, respectively. Thus, the contact 52 provides electrical engagement between one lead of the DIP 14 and the microelectronic device 38 mounted in the carrier, and the socket contact 28 in the adapter provides electrical connection from the lead 20 to a conductive trace 38 on the printed circuit board 12 via the plated-through hole 36 in the board associated with the trace. Hence, the DIP 14, device 38 and printed circuit board trace are interconnected. Of course, if no contact is mounted in any particular cavity 42 of the carrier, the circuit conditions between the DIP and the printed circuit board remain undisturbed.

Figure 2:
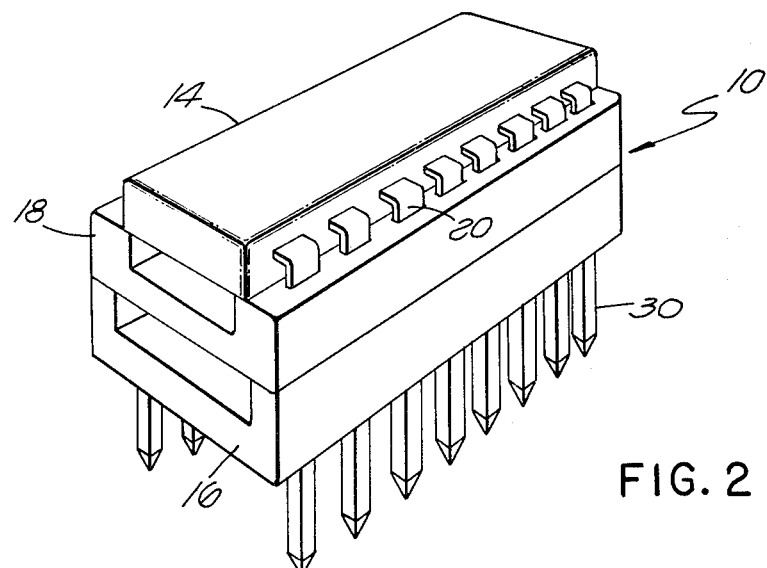
FIG. 2 is a perspective view showing the components of the electronic package assembly of FIG. 1 fully assembled.

FIG. 2 illustrates the DIP 14, carrier 18 and adapter 16 mounted together in an assembly suitable to be mounted directly into a printed circuit board. It will be appreciated that the parts of the assembly may be readily disconnected so that the user may replace or alter the number of devices 38 mounted on the carrier 18, or add to, reduce or alter the position of the contacts 52 in the carrier. Thus, the circuit components can be changed or rearranged to suit the circuit board designer without changing the printed circuit board configuration except to increase the DIP couple by the carrier thickness. Therefore, the present invention allows a great deal of freedom in altering an electronic packaging system without making the printed circuit board larger or more complex.

Figure 5:
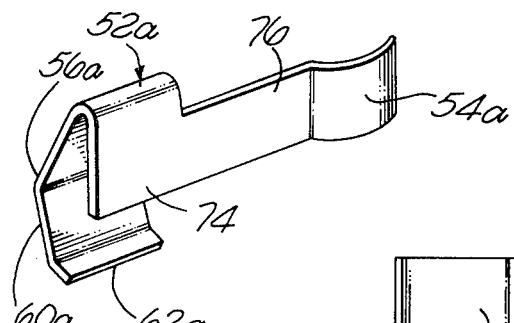
FIG. 5 is a perspective view of a modified form of a contact which may be utilized in the carrier of the invention.
Figure 6:
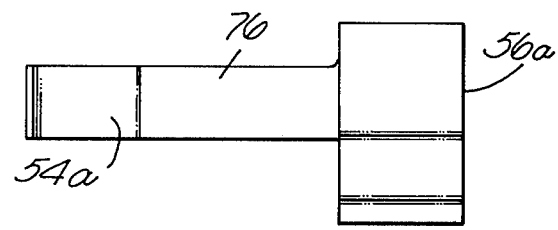
FIG. 6 is a rear view of the contact illustrated in FIG. 5.

Reference is now made to FIGS. 5 and 6 which illustrate a modified form of the contact of the present invention, generally designated 52a. The contact has an outer spring portion 56a with a reversely bent end section 60a terminating in a latching tab 62a similar to the contact 52. However, the inner portion 74 of the contact which extends into the recess of the carrier is substantially vertical, rather than inclined outwardly as in the contact 52. The vertical inner portion 74 embodies a longitudinal extension 76 terminating in a bowed inner spring portion 54a so that said inner spring portion is longitudinally spaced from the outer spring portion 56a of the contact.

Figure 8:
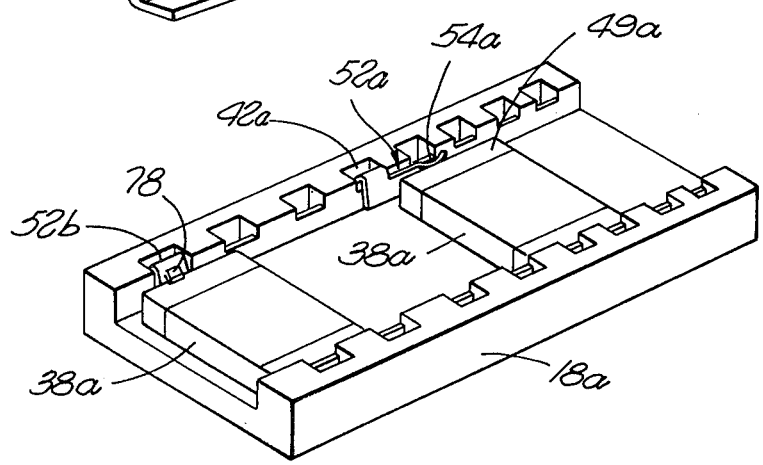
FIG. 8 is a perspective view of the carrier of the present invention incorporating the contacts illustrated in FIGS. 5-7.

FIG. 8 shows a carrier 18a having a microelectronic device 38a mounted thereon with the outer spring portion 56a of the contact 52a mounted in a contact cavity 42a spaced from the device, but with the bowed inner spring portion 54a aligned with the device to resiliently engage the conductor 49a on the device. Thus, electrical connection may be provided between a particular lead of a DIP and the conductor of the device 38 even though the device is offset from the cavity 42a in which the lead is mounted.

Figure 7:
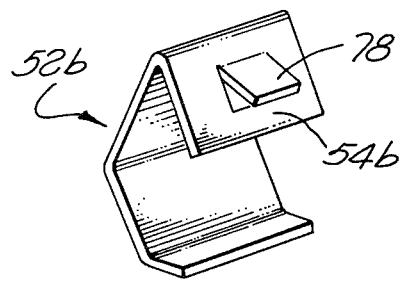
FIG. 7 is a perspective view of another embodiment of the contact which may be utilized in the carrier of the invention.

Reference is now made to FIG. 7 of the drawings which shows a further embodiment of the contact of the invention, generally designated 52b. In this embodiment, a retention tab 78 is struck out from the inner spring portion 54b of the contact. Thus, when the contact is mounted in a cavity of the carrier of the present invention, as shown in FIG. 8, the tab 78 will serve to retain a microelectronic device 38a in the recess of the carrier. It will be appreciated that the tab will deflect inwardly when the device 38 is pressed downwardly into the recess, and will spring outwardly into the recess over the device after its upper surface passes the bottom of the tab. The device may be removed from the recess in the carrier by simply depressing the tab 78 inwardly. It will, of course, be appreciated that normally two contacts 52b would be mounted on opposite sides of the device in the carrier so that both edges of the device are firmly retained in the recess thereof.

Figure 9:
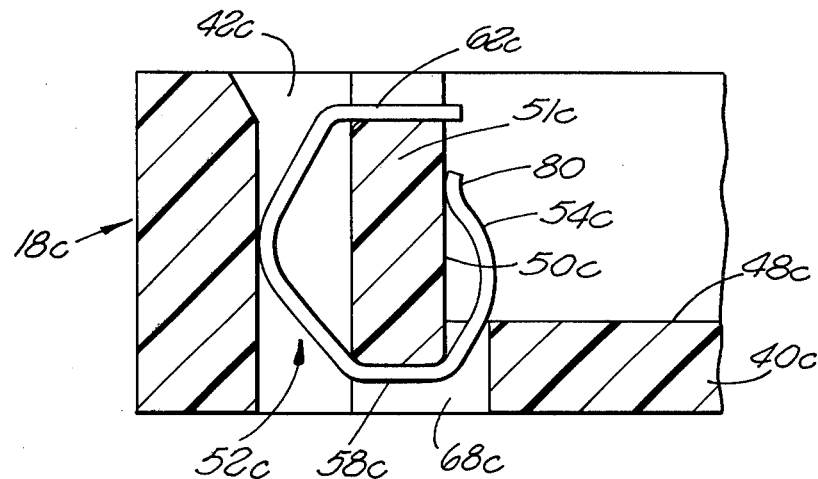
FIG. 9 is a fragmentary, transverse vertical sectional view through a second embodiment of the carrier of the present invention.
Figure 10:
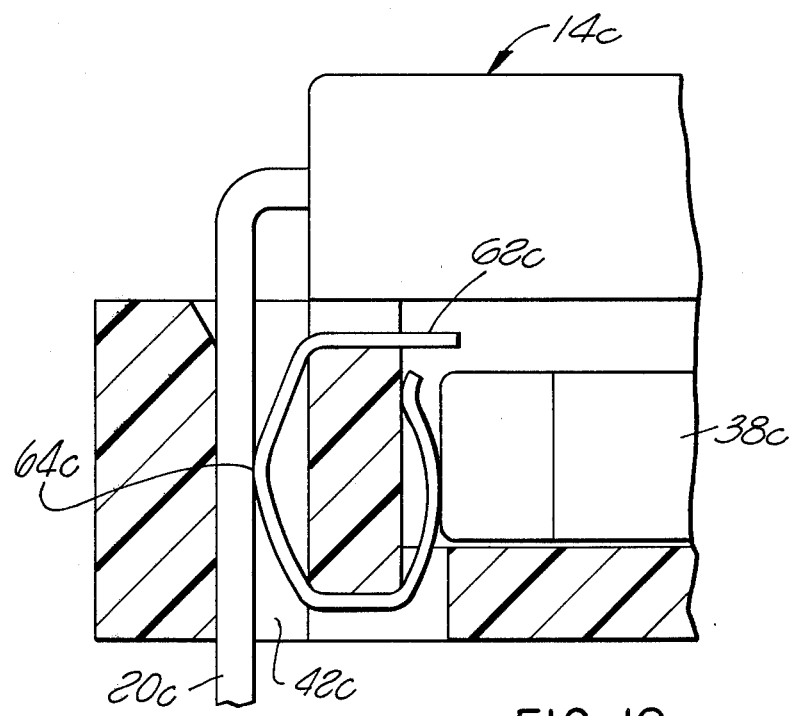
FIG. 10 is a sectional view similar to FIG. 10 showing a DIP mounted on the carrier.

Reference is now made to FIGS. 9 and 10 of the drawings, which show a further embodiment of the carrier of the present invention, generally designated 18c. In this embodiment, the contact 52c is inverted as compared to the contact 52 in that the bridging portion 58c of the contact extends across the bottom of the insulation barrier 51c while the latching tab 62c extends across the top of the barrier. The slot 68c in the carrier insulator 40c opens at the bottom of the recess 48c so that the inner spring portion 54c of the contact may extend through the slot into the recess. The spring portion 54c has a somewhat bowed configuration so that its terminal end 80 engages the side 50c of the recess, thus allowing a device 38c to be pushed down into the recess as seen in FIG. 10. When the lead 20c of a DIP 14c is inserted into the contact cavity 42c, the lead will be resiliently engaged by the contacting area 64c of the contact, and will cause the tab 62c at the top of the contact to shift inwardly over the device to retain the device in the recess 48c.

Figure 11:
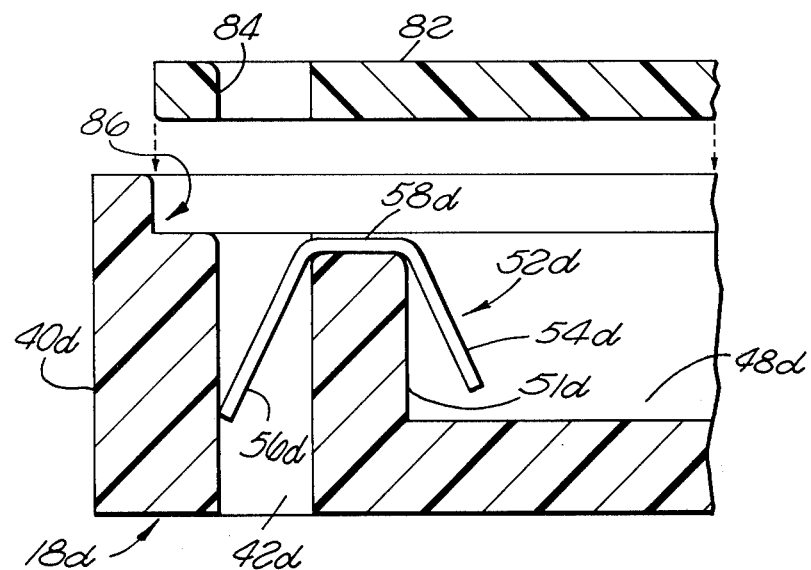
FIG. 11 is a fragmentary, exploded, transverse vertical sectional view through a third embodiment of the carrier of the present invention.
Figure 12:
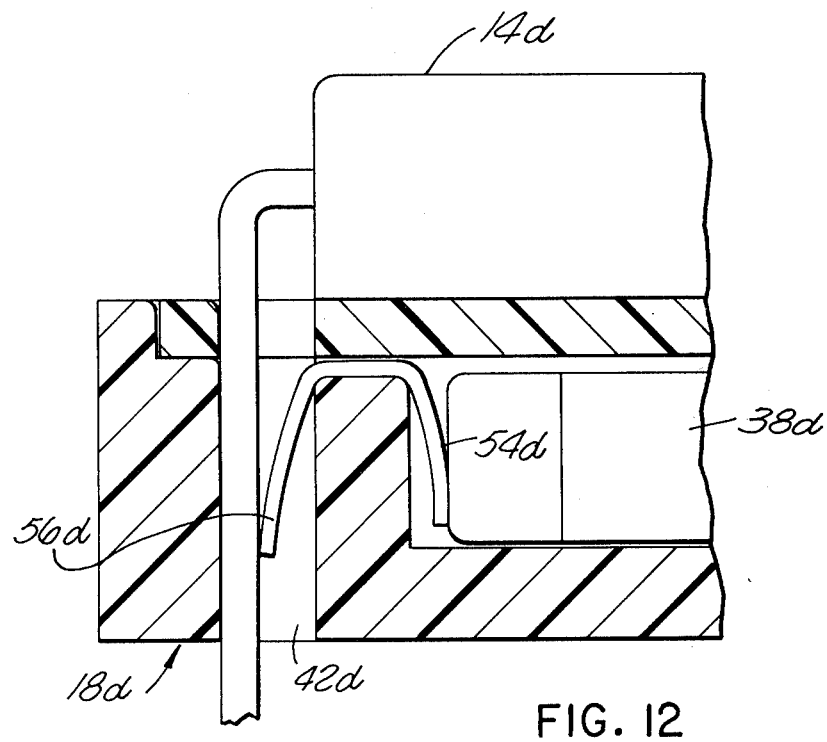
FIG. 12 is a fragmentary, transverse vertical sectional view similar to FIG. 11, showing the carrier fully assembled with a DIP mounted thereon.

FIGS. 11 and 12 show a further embodiment of the carrier of the present invention, generally designated 18d, wherein an insulator cover 82 is mounted on the insulator 40d. The cover embodies openings 84 aligned with the contact cavities 42d. The cover fits into a rectangular recess 86 formed in the upper surface of the insulator. The contact 52d has a somewhat simpler shape than the other contacts described hereinbefore since it is retained in place on the insulator 40d by the cover 82, thus eliminating the necessity of a latching tab on the contact. The contact 52d embodies a bridging portion 58d extending over the top surface of the barrier 51d, an inner spring portion 54d which extends inwardly and downwardly from the bridging portion 58d into the recess 48d, and an outer spring portion 56d which extends downwardly and outwardly into the contact cavity. After the contact is mounted in a desired cavity 42d, the cover 82 is placed in the recess 86 and retained therein by a suitable latching arrangement, not shown, or by bonding, thereby retaining the contacts in the insulator 40d. The completed carrier assembly with a microelectronic device 38d and a DIP 14d mounted thereon is illustrated in FIG. 12.

Figure 13:
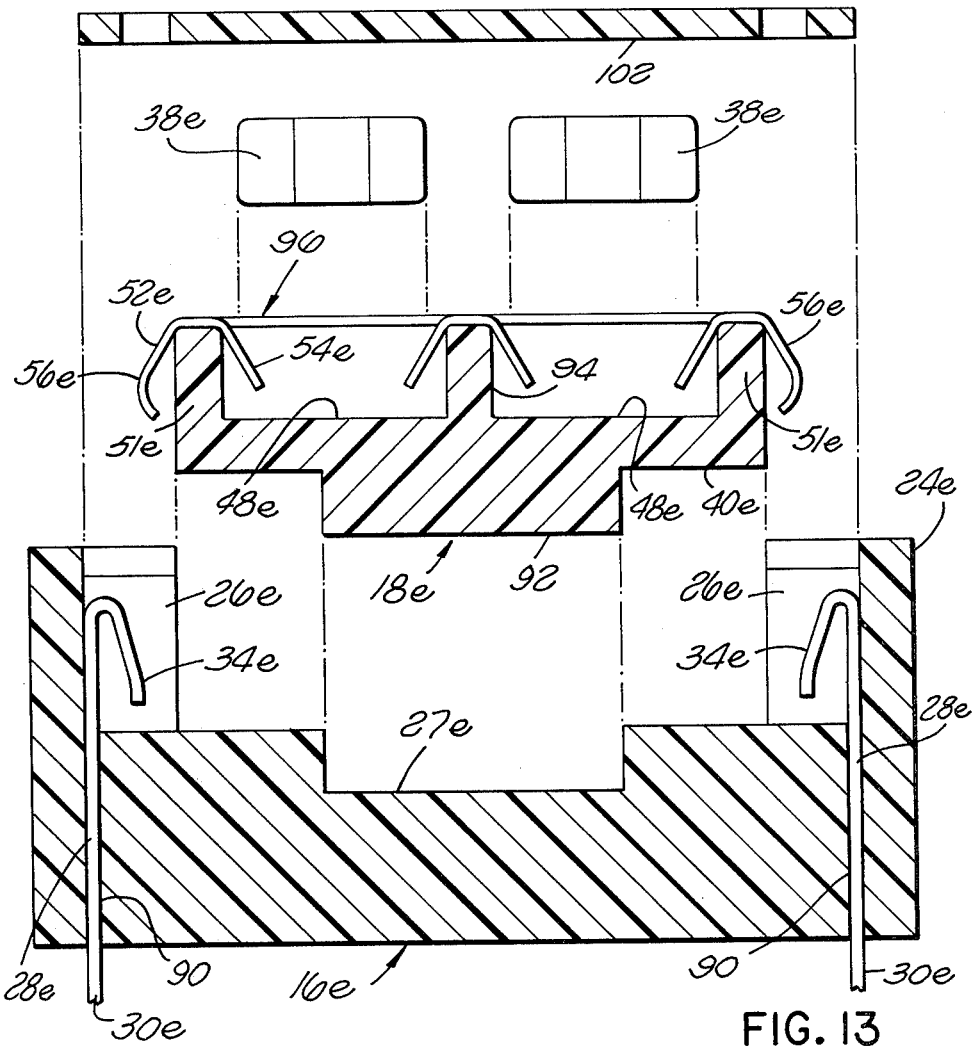
FIG. 13 is an exploded transverse vertical sectional view of a fourth embodiment of a carrier of the present invention together with a DIP adapter therefor.
Figure 14:
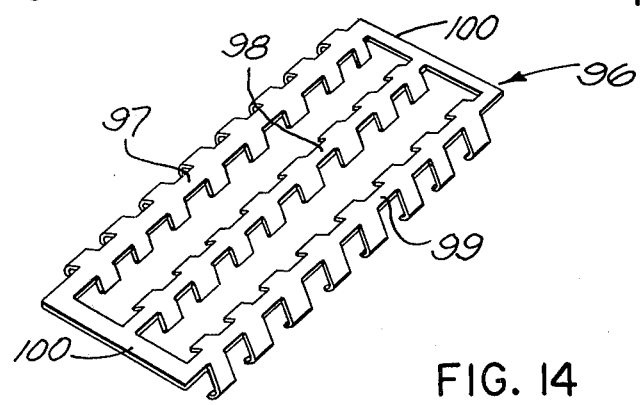
FIG. 14 is a perspective view of the contact assembly utilized in the carrier illustrated in FIG. 13.
Figure 15:
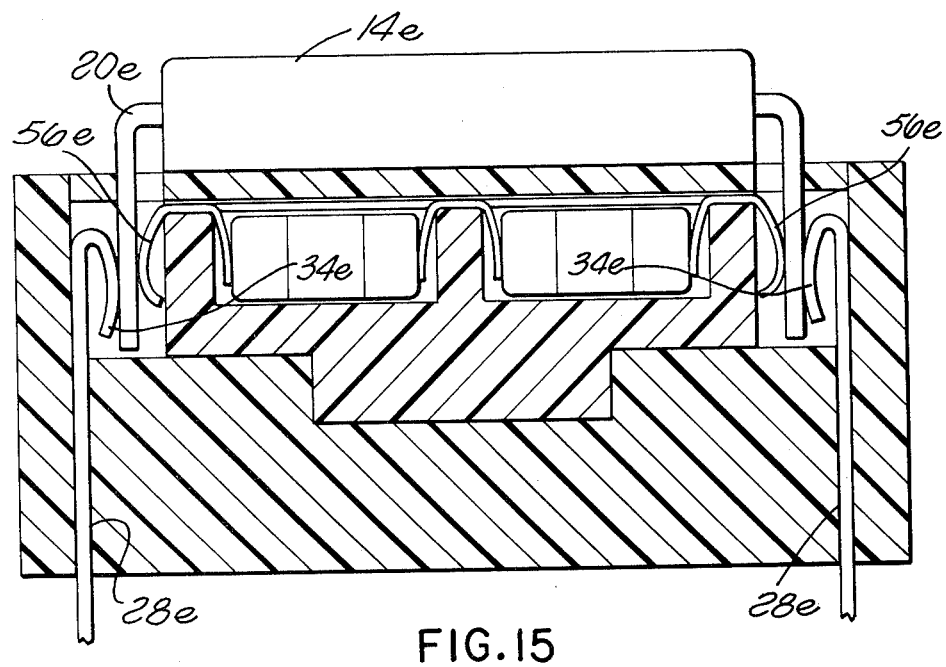
FIG. 15 is a transverse vertical sectional view of the carrier and DIP adapter illustrated in FIG. 13 shown assembled together with a DIP mounted thereon.

Reference is now made to FIGS. 13-15 which illustrate still a further embodiment of the invention in which the carrier 18e and DIP adapter 16e are assembled together to provide a single unit upon which the DIP 14e is mounted as seen in FIG. 15. The insulator 24e of the adapter has two rows of narrow vertical passages 90 which extend downwardly from the contact cavities 26e of the insulator. The tails 30e of the contacts 28e in the adapter are mounted in the passages 90 while the upper portions of the contacts embody downwardly and inwardly extending spring beams 34e.

The insulator 40e of the carrier 18e has a downwardly extending projection 92 which fits into the recess 27e in the adapter insulator 24e. The insulator 40e of the carrier contains two rows of spaced recesses 48e separated by a longitudinally extending center barrier 94. Outer barriers 51e form the outer walls of the recesses. The recesses are adapted to receive microelectronic devices 38e which may be in the form of chip capacitors, for example.

The contacts utilized with the carrier 18e may be individual contacts similar to the contacts 52d illustrated in FIGS. 11 and 12. However, preferably, the contacts 52e in this embodiment are provided on a conductive frame 96, best seen in FIG. 14. The frame comprises three longitudinally extending parallel strips 97, 98 and 99 joined by laterally extending end sections 100. The inner and outer spring portions 54a and 56e of the contacts 52e are integral with the strips 97 and 99 so that the portion of each strip joining the spring portions of the contacts constitutes the bridging portion of the contacts which extend over insulation barriers 51e of the insulator 40e. The outer spring portions 56e of the contacts formed on the outer strips 97 and 99 of the frame 96 extend toward the contact cavities 26e opposite to the spring portions 34e of the contacts 28e mounted therein when the carrier insulator is mounted on the adapter insulator, as seen in FIG. 15. The inner spring portions 54e of the contacts on the outer strips 97 and 99 extend into the recesses 48e to engage the outer conductors on the chip capacitors 38e. The spring portions of the contacts formed on the central strip 98 of the frame extend into the adjacent pair of recesses 48 to engage the inner conductors on the chips 38e.

To form the assembly illustrated in FIG. 15, first the conductive frame 96 is mounted on top of the carrier insulator 40e. Thereafter, the chips 38e are mounted in the recesses 48e in the carrier, and are retained thereon by a cover 102. The cover may be secured to the insulator by latches, not shown, or by bonding. The assembly thus formed is then mounted on the insulator 24e of the adapter 16e as seen in FIG. 15. The insulator parts may be releasably interconnected, or permanently secured together by bonding or the like. It will be appreciated that when the carrier and adapter elements are assembled together, the contact cavities 26e of the adapter will function as the contact cavities for the outer spring portions 56e of the contacts on the strips 97 and 99.

As seen in FIG. 15, when a DIP 14e is mounted on the carrier-adapter assembly, the leads 20e thereof will be pushed between the outer spring portions 56e on the outer strips of the conductive frame 96 and the inwardly extending spring portions 34e of the contacts 28e, so that a resilient electrical connection is provided between the DIP leads, the chips 38e and the contacts 28e.

Figure 16:
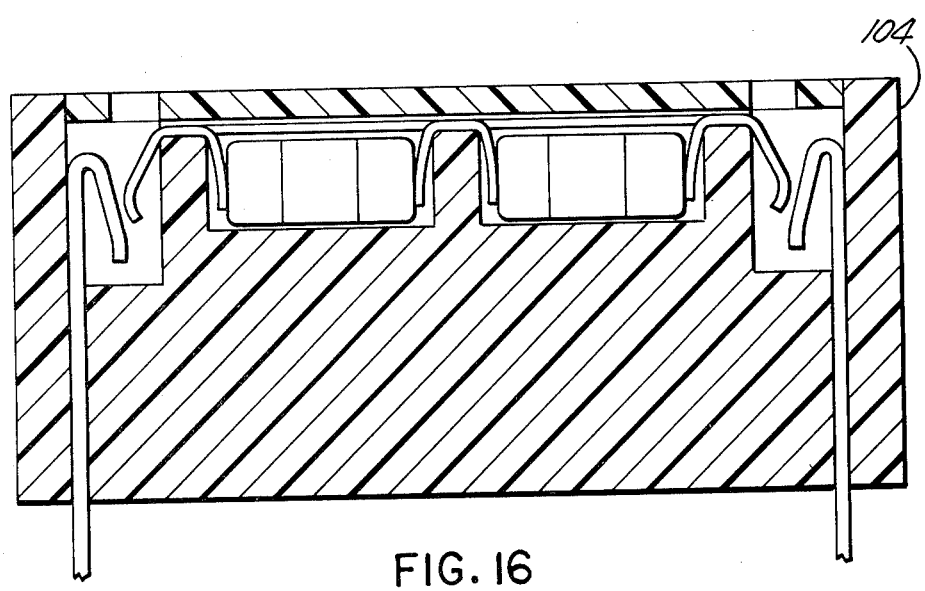
FIG. 16 is a transverse vertical sectional view through an integrated carrier-DIP adapter similar to the separable assembly illustrated in FIGS. 13-15.

The carrier-adapter assembly 104 illustrated in FIG. 16 is essentially the same as that illustrated in FIG. 15 except that the insulator is formed of one piece, rather than two parts.

Reference is now made to FIG. 17, which shows another embodiment of the carrier 18f of the present invention, shown in plan view. In this embodiment, the carrier insulator 40f contains two rows of recesses 48f containing chip capacitors 38f. Two rows of contact cavities 42f are formed along opposite sides of the insulator spaced from the recesses 48f providing insulation barriers 51f therebetween. Contacts 52f, which may be identical to the contacts 52d, are mounted in each of the cavities 42f with the bridging portions of the contacts extending over the barrier 51f. The inner spring portions 54f of the contacts engage the outer conductors of the chips 38f in the recesses 48f.

A conductive frame 96f is mounted on the upper surface of the insulator 40f. The frame 96f differs from the frame 96 in FIG. 4 in that no contacts are formed on the outer strips of the frame which engage the chips 38f. The contacts 52f on the center strip 98f of the frame engage the inner conductors of the chips 38e in the carrier. Thus, the inner strip forms a ground bus interconnecting one of the conductors of all the chips in the carrier. A ground pick-up tab 106 is formed on the outer strip 97f of ground bus frame 96f resiliently engaging a ground contact in the carrier. When a DIP is mounted on the carrier, the lead thereon corresponding with the ground contact will engage both the contact and the tab 106 so that a ground connection is made to such lead and one conductor of each of the chips through the frame 96f.

It will be appeciated that the carrier of the present invention may take a number of different forms. Furthermore, the carrier is not limited to use between a DIP and DIP adapter, as has been specifically described and illustrated herein. For example, the carrier could be modified to have circular contact cavities therein, and mounted between mating standard electrical connector members having pin and socket contacts, wherein the pin contacts would extend through the contact cavities in the carrier to engage the contacts therein, and through the carrier into the socket contacts of the mating connector member. In such an arrangement, the carrier may have a rectangular configuration, corresponding to the rectangular configuration of the connector, or a circular configuration if the shells of the connector are circular. Other modifications and variations of the invention will be apparent to those skilled in the art.

What is claimed is:

1. An electronic package assembly comprising:
a carrier mounted between a DIP and a DIP adapter, said DIP embodying a row of vertical conductive leads and said DIP adapter containing a row of terminals;
said carrier comprising:
an insulator having a top surface and a bottom surface;
a plurality of contact cavities in said insulator extending from said top surface to said bottom surface, said cavities being arranged in a row corresponding to said row of leads;
a recess in said insulator spaced from said row of cavities defining therebetween an insulation barrier;
contacts associated with selected ones of said cavities;
each said contact having a first spring portion extending into said cavity and a second spring portion extending into said recess, and a bridging portion extending around said barrier;
said vertical conductive leads of said DIP extending downwardly into said cavities engaging said first spring portions of said contacts and downwardly into said DIP adapter engaging said terminals therein; and
a microelectronic device mounted in said recess having conductors engaging said second spring portions of said contacts whereby said DIP leads, DIP adapter terminals and microelectronic device conductors are electrically interconnected.

2. An assembly as set forth in claim 1 wherein:
said bridging portion of each said contact extends over the top of said barrier; and
said first and second spring portions extend downwardly and outwardly from said bridging portion into said cavity and recess, respectively.

3. An assembly as set forth in claim 1 wherein:
said bridging portion of each said contact extends under the bottom of said barrier;
said first and second spring portions extend upwardly and outwardly from said bridging portion into said cavity and recess, respectively; and
said first spring portion includes a reversely bent end section extending upwardly toward the top of said barrier.

4. An assembly as set forth in claim 1 wherein:
at least one of said contacts embodies a retention tab extending laterally from adjacent said bridging portion into said recess for retaining said microelectronic device therein.

5. An assembly as set forth in claim 1 wherein:
said barrier embodies an upper surface and a lower surface;
said bridging portion of each said contact extends over one of said surfaces; and
said first spring portion has a reversely bent terminus extending over the other of said surfaces for retaining said contact in its respective cavity.

6. An assembly as set forth in claim 1 wherein:
the second spring portion of at least one of said contacts is spaced in the direction of said row of cavities from said first spring portion for engaging a microelectronic device conductor remote from the cavity in which said one contact is mounted.

7. An assembly as set forth in claim 1 including:
terminal means in each of said cavities spaced from said barrier;
said terminal means having an upper spring contacting portion extending toward said first spring portion of said contact engaging a DIP lead, and a lower tail portion extending below said insulator for connection with a conductive socket.

8. An assembly as set forth in claim 1 including:
a conductive strip on said insulator having at least one integral spring tab extending into said recess engaging a conductor on said microelectronic device.

9. An assembly as set forth in claim 8 wherein:
said contacts are integral with said strip; and
said second spring portions of said contacts form said tabs.

10. An assembly as set forth in claim 8 wherein:
said recess opens at one of said surfaces;
said strip is mounted on said one surface of said insulator; and
said bridging portions of said contacts are provided by said strip.

11. An assembly as set forth in claim 1 including:
a conductive strip on said insulator running parallel to said row of cavities; and
said strip embodying a plurality of spring tabs extending into said recess engaging conductors on said microelectronic device.

* * * * *